United States Patent [19]

Rilly et al.

[11] 4,245,180
[45] Jan. 13, 1981

[54] REGULATED POWER SUPPLY DEVICE FOR A LINE SWEEP CIRCUIT IN A TELEVISION RECEIVER

[75] Inventors: Gérard Rilly; Michel Facon, both of Paris, France

[73] Assignee: Thomson-Brandt, Paris, France

[21] Appl. No.: 35,217

[22] Filed: Apr. 30, 1979

[30] Foreign Application Priority Data

May 2, 1978 [FR] France .................. 78 12904
Mar. 2, 1979 [FR] France .................. 79 05504

[51] Int. Cl.³ .......................................... H01J 29/70
[52] U.S. Cl. ........................... 315/411; 358/190
[58] Field of Search .............. 315/411, 408, 399; 358/190

[56] References Cited

U.S. PATENT DOCUMENTS 3,767,960  10/1973  Ahrens .................. 315/408
3,950,673   4/1976  Gries ..................... 315/408

Primary Examiner—Theodore M. Blum
Attorney, Agent, or Firm—Karl F. Ross

[57] ABSTRACT

A regulated power supply device, in particular for a line sweep circuit in a television receiver, containing a chopper circuit (10) which contains in series an inductor (16) and a bidirectional switch (15), which is controlled and mounted in parallel with a capacitor (13), forming a resonant circuit with the inductor (16) when the chopper switch (15) opens. The inductor (16) contains a winding (21), called the power supply winding, of a transformer (20), called the line transformer, in which another winding (22), mounted in series with a reservoir capacitor (33), is connected in parallel with another bidirectional switch (35 and 36), which equips the line sweep output stage (30). The transfer of energy between the chopper circuit (10) and the output stage (30) is done through the windings (21 and 22) of the transformer (20) and its effect is to charge the reservoir capacitor (33) which feeds, apart from the output stage (30), the preceding stages of the sweep circuit (which are not shown). The regulation is done by means of a regulation circuit (40) which receives the line return pulses from an additional winding (25) on the transformer by causing the phase shift to vary between the cut off (opening) instants of the two switches (10 and 35, 36).

8 Claims, 21 Drawing Figures

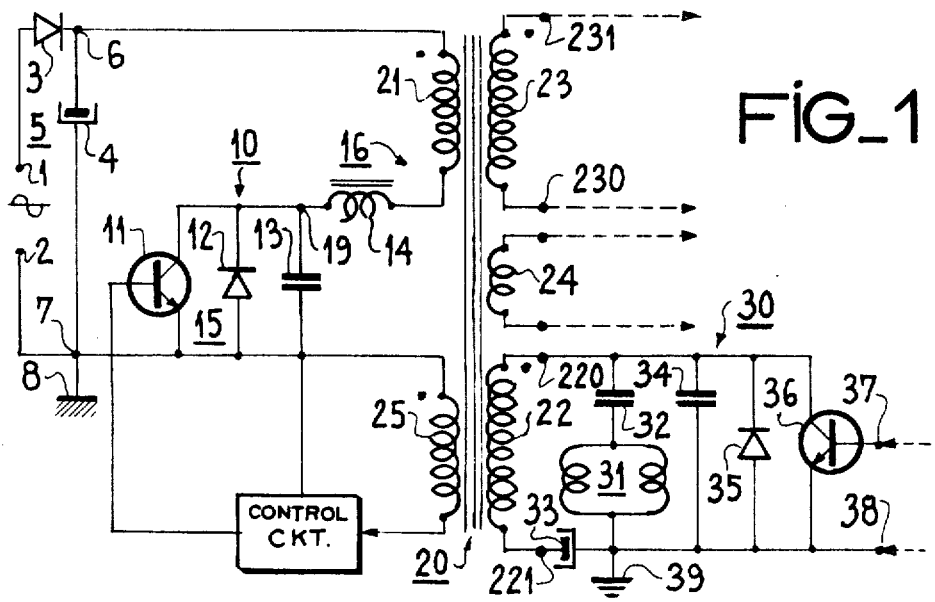
FIG_1
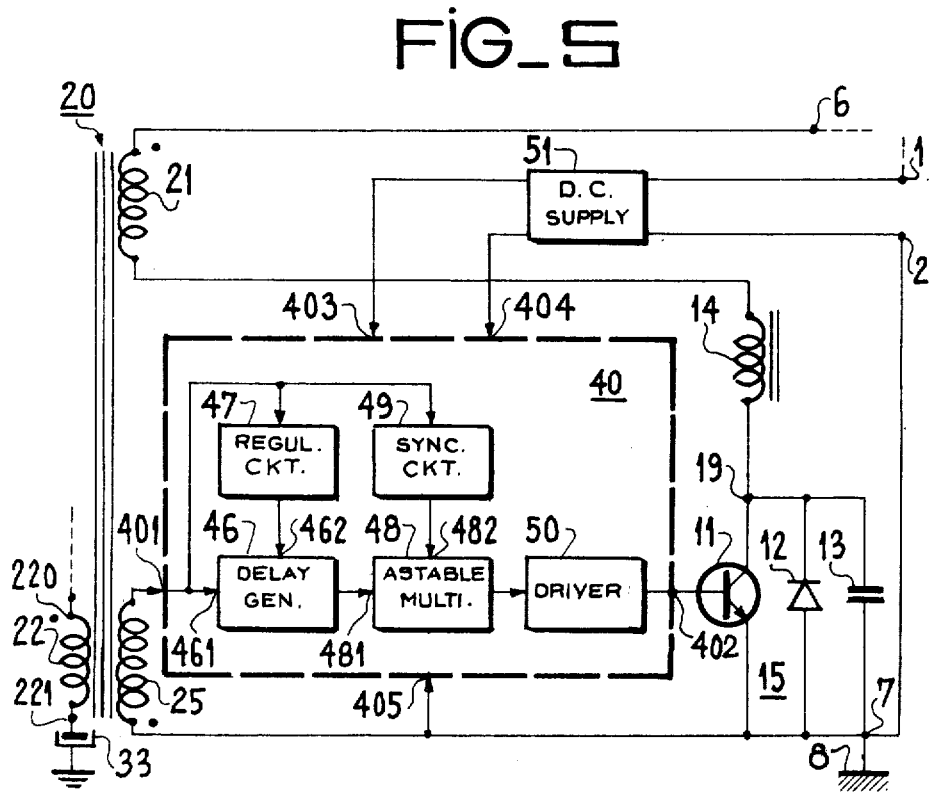
FIG_5

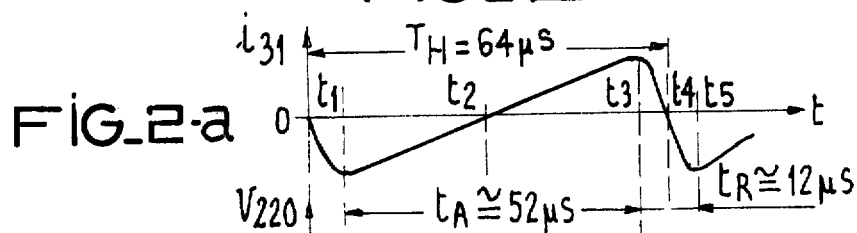
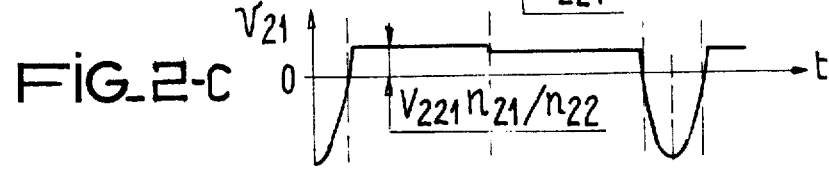
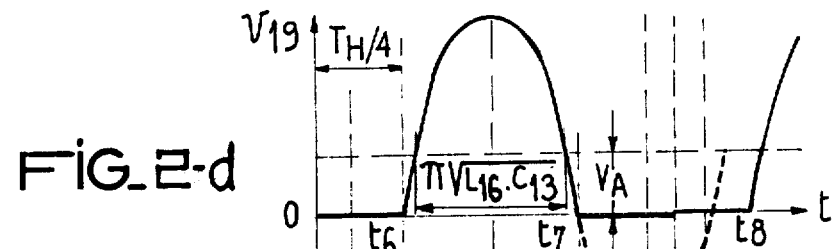
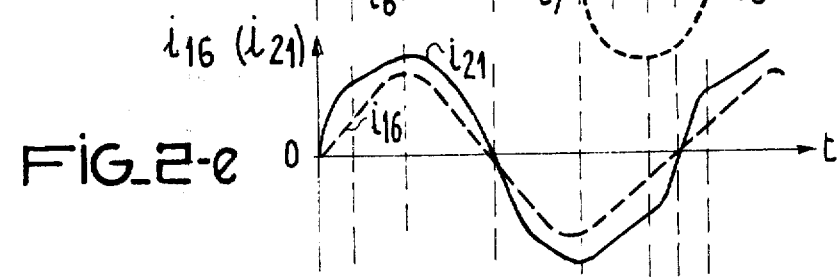
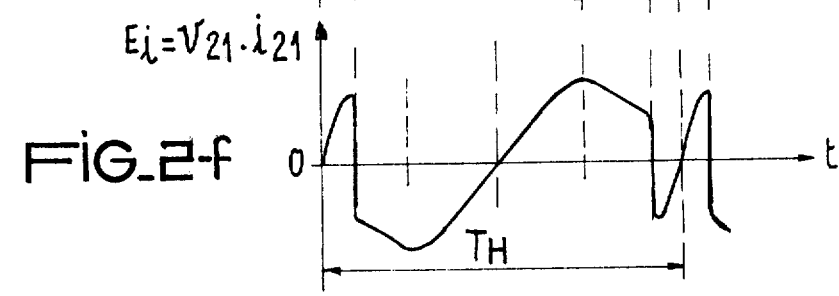

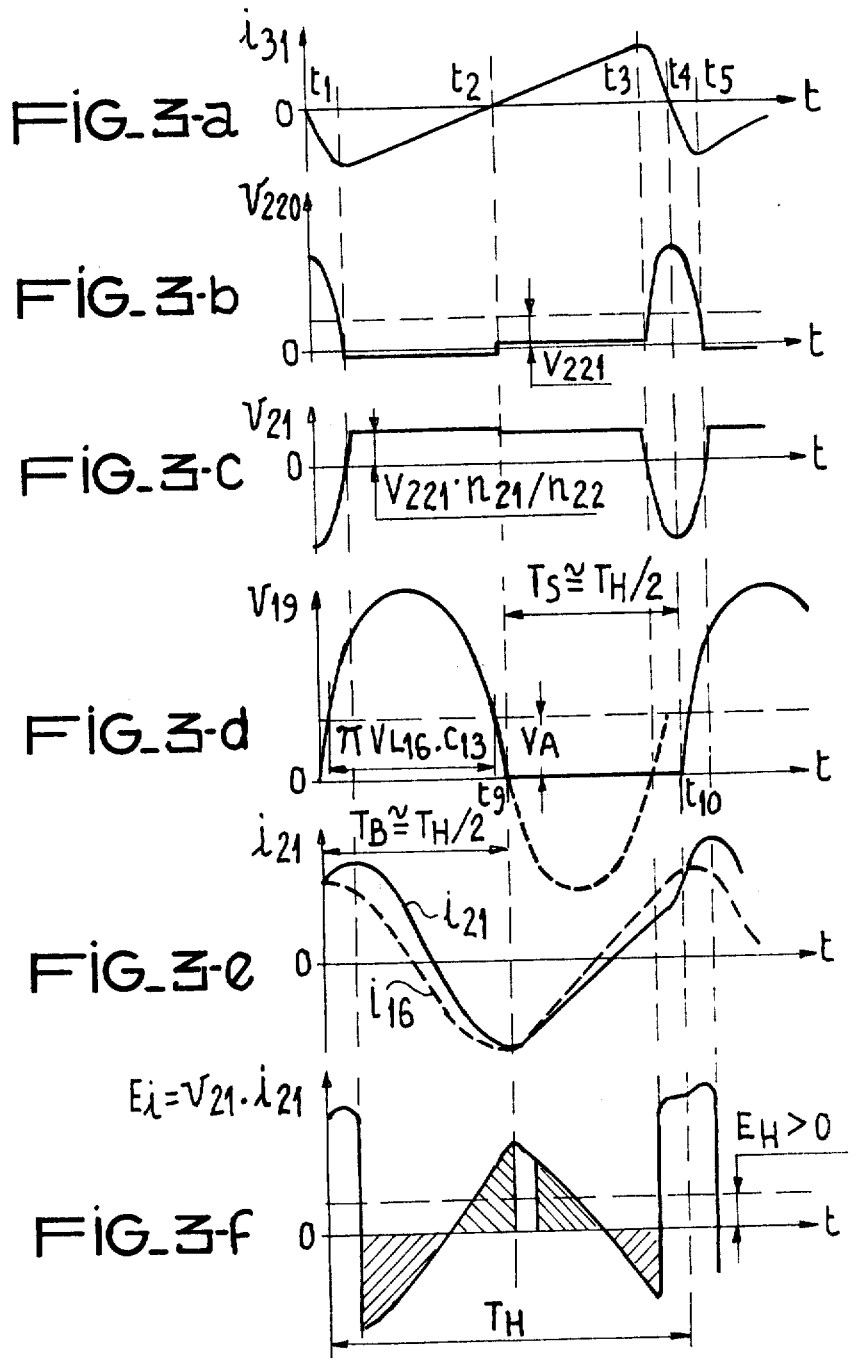

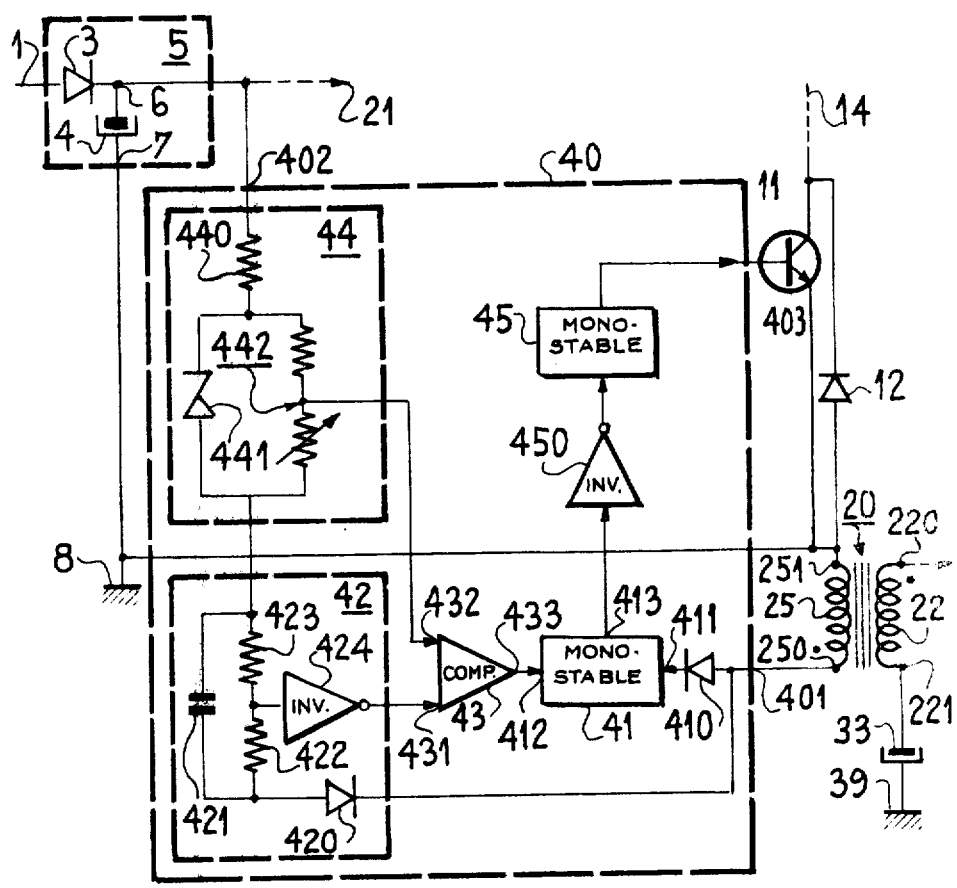
FIG_4

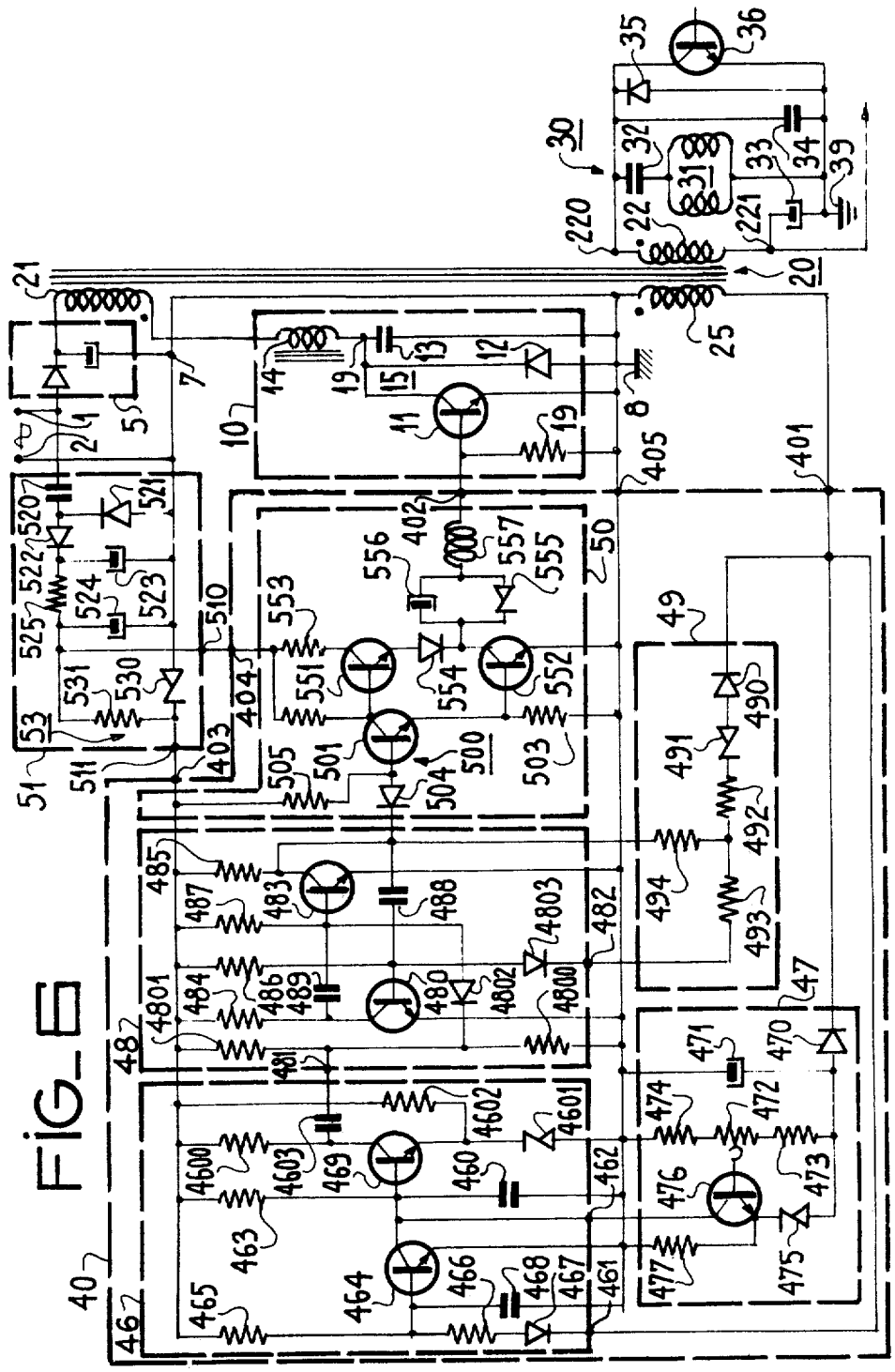
FIG_6

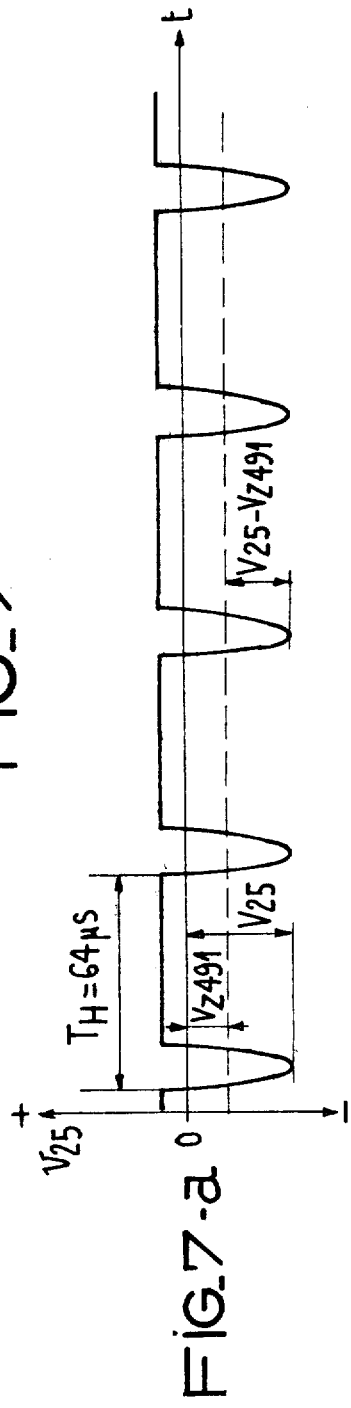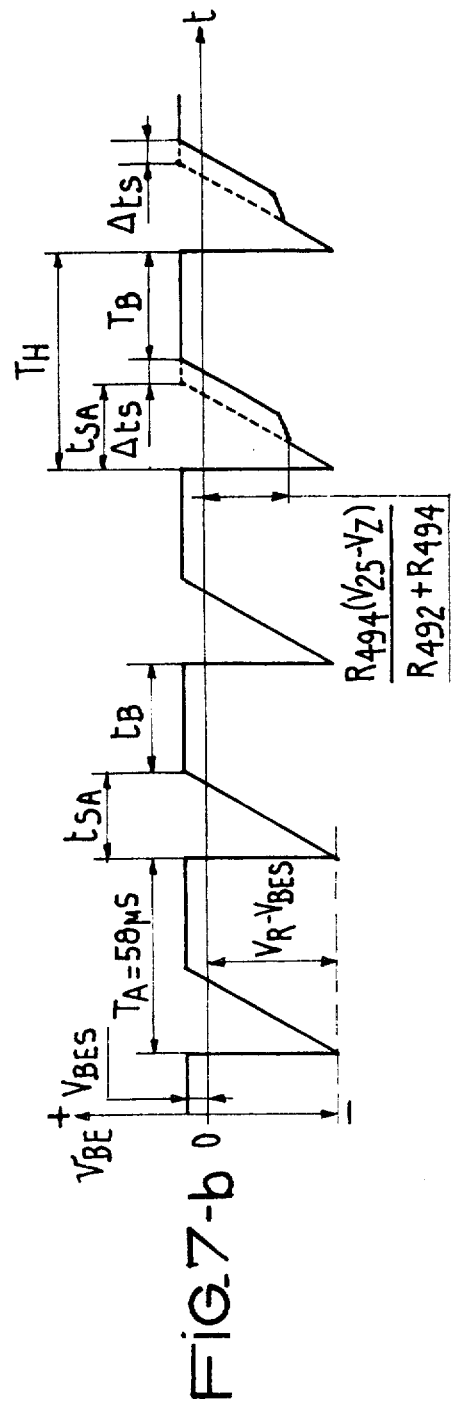
FIG._7

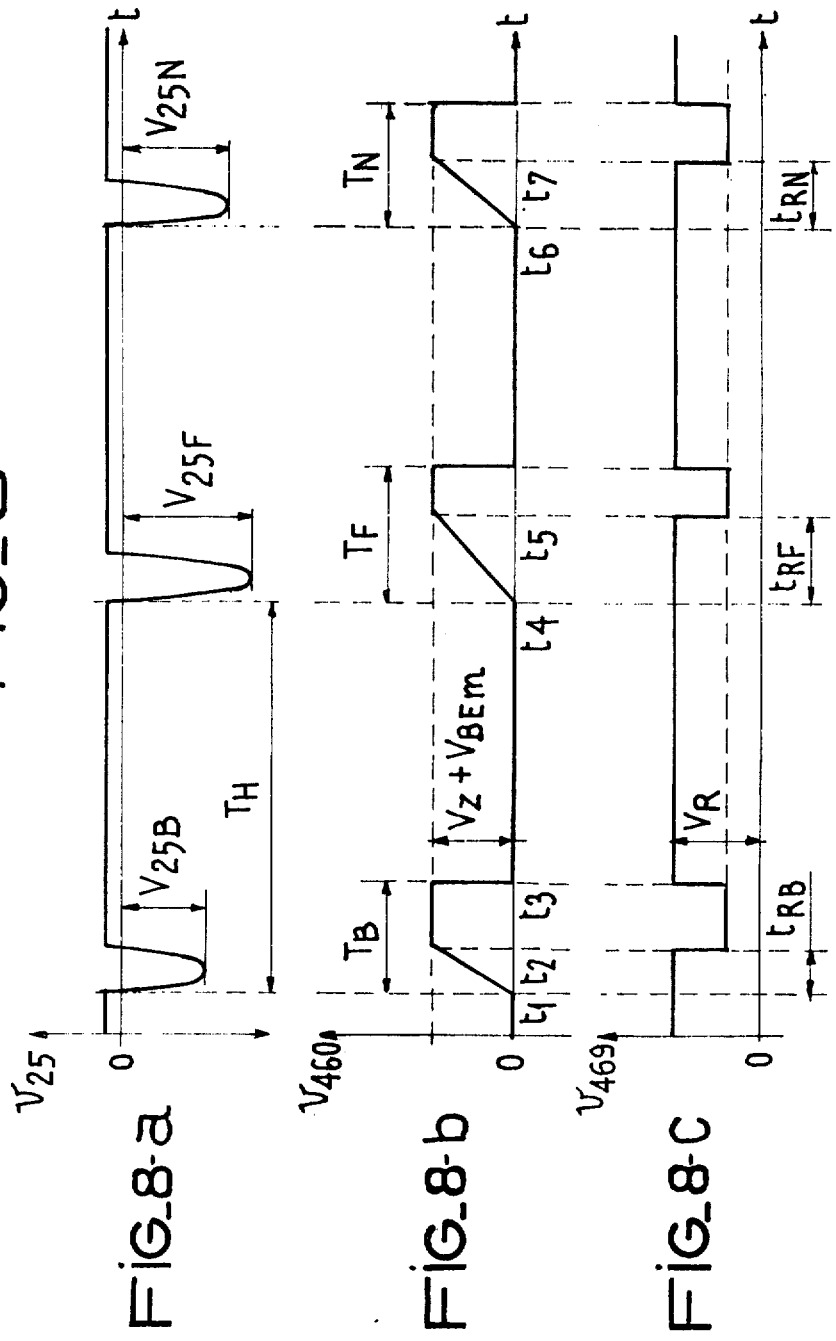

REGULATED POWER SUPPLY DEVICE FOR A LINE SWEEP CIRCUIT IN A TELEVISION RECEIVER

The present invention concerns a regulated power supply device, in particular for a line sweep circuit in a television receiver, which can also provide D.C. supplies to other circuits in this receiver by splitting up a D.C. supply voltage which is usually obtained by the rectification and filtering of the A.C. mains voltage by means of a chopper.

Known chopper converters of this type contain, generally connected in series between the output terminals of a D.C. power supply source (filtered rectifier), an electronic switch such as a switching transistor operating in the saturated and cut off mode and an inductor which includes the primary winding of a transformer in which at least one secondary winding supplies the A.C. energy obtained by the chopping, which is then rectified to provide the D.C. supply voltages with a ground insulated from the mains. In most of the known chopper power supplies, one can vary the output voltages by action on the cyclic ratio, i.e. the length of the saturated (closed) state of the switch, for example, by controlling periodically the transistor-chopper by means of a monostable flip-flop of variable length as a function of a voltage which may be picked up at the output of a rectifier fed by a secondary winding of the transformer so as to form a regulation loop.

Chopper power supplies have frequently been used in television receivers to eliminate the bulky and heavy mains supply transformer and make possible a regulation of the D.C. power supply voltage for this receiver. They have often been combined in particular at the output stage of the horizontal sweep circuit which supplies them with a pulse signal at the line frequency that can be used to control the chopping. Various combinations of sweep circuits and chopper power supplies have described, for example, in the French patents or patent applications with publication Nos. 2.040.217, 2.060.495, 2.167.549, 2.232.147 or 2.269.257, in which the regulation is also done by means of the variation in the cyclic ratio of the saturated and cut off states of the chopper transistor which, in some cases, is also used as the active element of the (final) output stage of the line sweep circuit or of the feeder stage which controls this circuit.

Chopper power supplies of the so called "pump" type in which the chopper transistor feeds one of the windings of the line transformer during the line return periods and in which the regulation is done by means of the variation of the internal resistance of this transistor or of a "ballast" transistor in series with this transistor are known, for example, from the French patents with publication Nos. 2.014.820, 2.025.365 or 2.116.335. A circuit of the "pump" type whose chopper transistor has a winding of the line transformer in its collector circuit and in which the sweep circuit is electrically insulated from the mains has been described in the article by Peruth and Schrenk in the German periodical, SIEMENS BAUTEILE REPORT Vol. 12 (1974), No. 4, pages 96-98. Its structure corresponds to the contents of the introduction to claim 1. In circuits of the "pump" type, the chopper transistor or the "ballast" transistor in series with it dissipates an amount of energy which is not negligable.

In the chopper device supplying power to the output stage of the line sweep circuit with which it is combined in accordance with the invention, one no longer uses regulation by variation of the internal resistance or of the length of the saturated state of the chopper transistor (or by variation of the cyclic ratio of the chopping with a constant periodicity) but one does the regulating by variation of the relative phase between the signals of the same frequency which are supplied respectively by the chopper circuit with a constant cyclic ratio and by the output stage of the line sweep, each of which is connected to one of the windings of a transformer called the line transformer through which the transfer of energy between the chopper circuit and the sweep output stage takes place as well as in the direction of the other secondary windings of the line tranformer such as the very high tension (V.H.T.) winding.

In accordance with the invention, a regulated power supply device, in particular for a line sweep circuit of a television receiver which contains an output stage fitted with a line transformer in which a first winding is connected in series with a supply capacitor, is connected in parallel with a first bidirectional switch controlled at the line frequency, the power supply device containing a chopper circuit with, connected in series between the terminals of a source of a D.C. power supply voltage, an inductor and a second electronic switch, which can also be controlled at the line frequency. The inductor in this circuit contains a second winding of the transformer which is intended for the transfer of energy between the chopper circuit and the output stage. This power supply device is in particular characterized by the fact that the second switch, which is also bidirectional and mounted in parallel with a tuning capacitor, is so controlled as to be alternately open and closed during each line period with a constant cyclic ratio and by the fact that the regulation of the power supplied and hence of the voltage at the terminals of the supply capacitor is done by variation of the phase delay between the respective opening instants of the first and second switch as a function of the peak amplitude of the line return pulse for example.

In accordance with a preferred way of making the invention, a power supply device in accordance with the preceding paragraph, in which the second bidirectional switch, which contains a switching transistor, is controlled on its base by a regulation circuit in which one input is fed by an auxiliary secondary winding of the line transformer supplying line return pulses, is remarkable in particular for the fact that the regulation circuit contains an unstable multivibrator controlling the base of the chopper transistor and operating independantly on starting up, a circuit generating a variable delay containing a phase shift stage, which is triggered by the line return pulses and supplies the multivibrator with triggering pulses that are delayed with respect to the leading edges of the line return pulses, which cause the cut off of the chopper transistor, and a regulator stage fed with the line return pulses and supplying to the phase shift stage a regulation signal which enables the delay in the triggering pulses to be varied with respect to the line return pulses as a function of one of the peak amplitudes or of the peak to peak amplitude of the line return pulses.

The invention will be better understood and others of its characteristics and advantages will appear from the description which follows, which is given as an example, and the drawings attached, which refer to it. Among them:

FIG. 1 represents part of a theoretical schematic diagram of a chopper power supply device combined with the output stage of the line sweep circuit in accordance with the invention;

FIGS. 2a-2f and 3a-3f are diagrams of the voltage wave forms and/or current wave forms at various points in the circuit of FIG. 1 to explain the operation of this circuit;

FIG. 4 represents part of a synoptic schematic diagram of a simple production model (without a starter device) of regulation circuit 40 in FIG. 1;

FIG. 5 represents a block diagram of a preferred production model of regulation circuit 40 in FIG. 1 in accordance with the invention;

FIG. 6 represents a theoretical schematic diagram of the whole of the preferred production model of the regulation circuit in FIG. 5;

FIGS. 7a and 7b represent voltage wave forms illustrating the slaving of the frequency of the unstable multivibrator 48 to that of the line oscillator; and FIGS. 8a-8c represent voltage wave forms illustrating the operation of the regulation by the variation in phase shift.

In FIG. 1 is shown schematically a chopper power supply device of line sweep output stage 30 in accordance with the invention which is electrically insulated from the A.C. mains which feed rectifier 5 whose output voltage is chopped. This power supply device has two terminals 1, 2 which are connected respectively to the two poles of the A.C. distribution mains (220 V, 50 Hz) and feed rectifier diode 3 and filter capacitor 4, whose capacity is high, which are connected in series and form together a rectifier assembly or a source of D.C. voltage 5. The output of rectifier assembly 5 formed by the two terminals 6 and 7 (plates) of the (electro-chemical) capacitor 4 is intended to supply a D.C. power supply voltage $V_A$ of the order of 300 V to chopper circuit 10. This chopper circuit 10 contains a controlled, bidirectional electronic switch 15, which consists of a switching transistor 11 of the NPN type connected with its emitter common and a junction semiconductor diode 12, which are connected in parallel in such a way as to conduct respectively in opposite directions (anti-parallel), and an inductor 16 consisting of a choke 14 and a winding 21 of a transformer 20, called a line transformer, connected in series. This winding 21 of line transformer 20 whose primary winding is normally connected in parallel with the coils of the horizontal deviation circuit in the circuit of line sweep output stage 30 to the supply, through secondary windings, supply voltages in particular to the cathode ray tube will be called in what follows the supply voltage winding, because the transfer of energy between chopper circuit 10 and output stage 30 will be done through it. Switch 15 is mounted in parallel with a capacitor 13 and it is connected in series with inductor 16 (choke 14 and power supply winding 21 in series) between the output terminals 6 and 7 of D.C. voltage source 5. This capacitor 13 forms, because of its low capacity with respect to that of filter capacitor 4, with inductor 16 a parallel, resonant (oscillatory) circuit when electronic switch 15 is opened by the cutting off of switching transistor 11 by means of a control signal applied to its base.

Switching transistor 11 is here connected by its collector to one of the terminals of inductor 16, whose other terminal is connected to positive terminal 6 of source 5 which supplies D.C. power supply voltage $V_A$, by its emitter to negative terminal 7 of source 5, which forms a ground, called the primary or hot ground, 8, which is connected to the A.C. mains but is insulated from that 39 of the television set. The base of transistor 11 is controlled by means of rectangular signals supplied by a regulation circuit 40, which is described further on, in such a way as to be alternately saturated and cut off. Regulation circuit 40 is, for example, fed by a secondary winding 25 of transformer 20, that supplies signals whose peak to peak amplitude is proportional to the peak amplitude of the line return pulse. This peak amplitude is a function of the energy transfer from chopper circuit 10 to the line sweep output stage 30 which is connected to another winding 22 of transformer 20.

One may note here that chopper circuit 10 resembles a classical, transistorized, line sweep output stage and that switching transistor 11 has been chosen to withstand high collector-emitter voltages (of the order of 1500 V), and that diode 12 has to withstand the same inverse voltage while switch 15 is open. One may also note that the inductance of choke 14 may be formed partly or wholly by the leakage inductance of power supply winding 21 in transformer 20.

The line sweep output stage 30, which is arranged in classical fashion, contains horizontal deviation coils 31 mounted in parallel and connected by one of their terminals to a first capacitor 32, called the "forward" or "S effect" capacitor, which feeds them during the forward sweep. The series mounting of coils 31 and forward capacitor 32 is connected in parallel, on the one hand, to a second controlled bidirectional switch containing a second switching transistor 36 and a second diode 35, called a "shunt" or "parallel" recuperation diode, which are connected in parallel to conduct in opposite directions, closed (conductor) during the forward sweep and open (cut off) during the return sweep, and, on the other hand, to a second capacitor 34, called the "return" capacitor, which forms, while the second switch is open, a parallel resonant circuit with the inductance of deviation coils 31. The common point of the collector of second transistor 36, of the NPN type, of the cathode of second diode 35 and return 34 and forward 32 capacitors is connected to one of the terminals 220 of winding 22 of transformer 20, which normally forms the primary winding of this transformer. The other terminal 221 of winding 22 is connected to one of the terminals of a third capacitor 33 of high capacity, whose other terminal is connected to the common point of deviation coils 31, return capacitor 34, the anode of second diode 35 and the emitter of second transistor 36, which is also connected to the ground 39 of the chassis of the television receiver, called the "cold" ground, because it is insulated from the A.C. power supply mains. It is at the terminals of this third capacitor 33 that one obtains the D.C. voltage feeding this stage, whose value determines, on the one hand, the peak to peak amplitude of the line sweep current of sawtooth form and, on the other hand, the amplitude of the line return voltage pulse which, when rectified after being transformed, supplies the very high voltage that polarizes the anode of the cathode ray tube (not shown here). The second transistor 36, also a switching transistor, is controlled by rectangular shaped signals supplied to input terminals 37 and 38 of stage 30, which are respectively connected to its base and its emitter, by a feed stage (not shown and called a "driver" in anglo-american literature) so that it is alternately cut off, during the sweep return, and saturated, during the second part of the forward sweep.

In classical transistor line sweep circuits, a D.C. voltage source generally feeds either terminal 221 of winding 22 directly or an intermediate connection to this winding through a diode (see French Pat. Nos. 1.298.087 dated Aug. 11, 1961, 1.316.732 dated Feb. 15, 1962 or 1.361.201 dated June 27, 1963) which isolates the primary winding of the line transformer from the D.C. voltage source during the line return interval.

In the circuit of FIG. 1, it is the A.C. electrical energy transmitted by chopper circuit 10 through windings 21 and 22 of transformer 20 which charges capacitor 33 so that it supplies a regulated supply voltage to output stage 30. During the line sweep forward periods, when the second bidirectional switch 35, 36 of sweep output stage 30 is closed (conductor), the terminals of winding 22 of transformer 20 are directly connected to those of capacitor 33 which will then receive the energy supplied of by chopper circuit 10.

In FIG. 1, line transformer 20 also has a very high voltage winding 23, one terminal 230 of which may be connected to the ground 39 (or to terminal 220 of winding 22) and whose other terminal 231 is connected to the input of the very high voltage rectifier assembly or voltage multiplier (not shown) in classical fashion, and an auxiliary winding 24 which may be used to feed either a low voltage rectifier assembly or a load regulator assembly or the filament of the cathode ray tube (not shown). These secondary windings 23, 24 will receive their energy mainly from output stage 30 of the line sweep circuit through winding 22 of transformer 20, i.e. the line return pulses, the coupling between the windings will hence be as close as possible.

The operation of the power supply device in FIG. 1 will be explained below with that of output stage 30 of the line sweep circuit, with reference to FIGS. 2 and 3 of the drawing attached, representing diagrams of the voltage wave forms and/or current wave forms at various points in the schematic diagram of FIG. 1.

In FIGS. 2 and 3, diagram (A) represents the saw tooth wave form of the sweep current $i_{31}(t)$ in the coils 31 of the horizontal deviation circuit. Diagram (B) represents the wave form of the voltage $v_{220}(t)$ on terminal 220 of winding 22, which is also that at the terminals of the second switch 35, 36. Diagram (C) is the wave form of the voltage $v_{21}(t)$ at the terminals of power supply winding 21 when its leakage inductance is negligable. It is obtained by the transforming of the A.C. component of voltage $v_{220}(t)$. Diagram (D) represents the wave form of the voltage $v_{19}(t)$ at the terminals of first switch 15 in chopper circuit 10, i.e. between the junction 19 of this chopper circuit with inductor 16 and primary ground 8, and diagram (E) represents as a dotted line the current $i_{16}(t)$ in inductor 16 when output stage 30 is not controlled and as a full line the current $i_{21}(t)$ resulting from the superimposition in winding 21 to current $i_{16}(t)$ on that induced by winding 22 when output stage 30 is working. Conversely, the current in winding 22 of transformer 20 results from the superimposition of the current induced by winding 21 on the current produced by the closing of the second switch 35, 36, which is analogous to $i_{31}(t)$ in diagram (A).

The wave forms of diagrams (D) and (E) in FIGS. 2 and 3 are out of phase respectively, one with respect to another, by a quarter of a line period $T_H/4$ to allow the illustration of the regulation by the variation in the relative phase of the voltage $v_{21}$ and current $i_{21}$ waves in power supply winding 21.

The diagrams (F) represent the instantaneous energy $E_i$ transmitted by chopper circuit 10 to the output stage 30, which is equal to the product of the wave forms of current $i_{21}(t)$ and voltage $v_{21}(t)$ in winding 21, i.e. $E_i = -v_{21} \cdot i_{21}$, for two different phase deviations between the voltage $v_{21}(t)$ and current $i_{21}(t)$ waves in power supply winding 21, which correspond respectively to a zero energy transfer in FIG. 2 and a maximum energy transfer in FIG. 3.

The operation of the line sweep output stage 30 is classical once the power supply capacitor 33 and forward capacitor 32 are charged to a D.C. voltage $V_{221}$ by means of a certain number of chopping cycles, which are independant on starting up, during which the negative half-cycles of the chopped voltage wave are rectified by recuperation diode 35.

During the forward sweep intervals $t_A$, when the switch 35, 36 is closed from instant $t_1$ to instant $t_3$, the current $i_{31}$ (see A) in the deviator varies roughly linearly between its negative peak values (at $t_1$) and positive ones (at $t_3$) with a passage through zero at instant $t_2$, when current $i_{31}$ passes from diode 35 to transistor 36, which has previously been polarized to conduct. This corresponds to a roughly zero voltage $v_{220}$ (see B) at the terminals of switch 35, 36.

The line return interval $t_R$ is started by the cutting off of transistor 36 at instant $t_3$, and the inductance of deviator 31 then acts as a parallel resonant circuit with the return capacitor 34 by causing the voltage $v_{220}(t)$ to pass through a positive half-sinusoid and reach its peak value at the instant $t_4$ (or $t=0$), called the line return pulse, and the current $i_{31}(t)$ to pass through a half-cosinusoid between the positive and negative peak values cited, with a passage through zero at the instant $t_4$ (or $t=0$). The mean value of the voltage wave form $v_{220}(t)$ at terminal 220 is equal to the D.C. power supply voltage $V_{221}$ at the terminals of power supply capacitor 33 and forward or S effect capacitor 32.

The respective peak to peak amplitudes of current $i_{31}(t)$ (hence the width of the screen sweep beam excursion) and of voltage $v_{220}(t)$ (hence the very high voltage) depend on the value of the D.C. voltage $V_{221}$ which feeds the horizontal sweep output stage and which, in most of the chopper power supplies of preceding techniques, is regulated and stabilized by modulating the length of the saturated state (the cyclic ratio) of chopper transistor 11 as a function of the amplitude of the line return pulse picked up on an auxiliary winding of line transformer 20 (hence of the voltage at the terminals of capacitor 33) and later of the rectified and filtered voltage in the network.

In accordance with the invention, the length $t_s$ of the saturated state of chopper transistor 11 and of the conducting state of diode 12 and, as a result, the ratio of this length to that of the complete cycle (line period $T_H$) or to that $t_B$ of the cut off state is constant and so chosen as to make the peak amplitude of voltage pulse $v_{19}$, which is applied to the collector of transistor 11 during the cut off interval $t_B$, considerably less than its collector-emitter D.C. breakdown voltage in the cut off state ($V_{CEX}$) which may exceed 1500 Volts. Thus, for a rectified voltage of 300 V, it is possible to limit the collector voltage $V_{19}$ to about 900 Volts by choosing a ratio $t_b/T_H$ of about 0.5.

As a result, chopper circuit 10 must operate at the line frequency with conduction lengths $t_S$ (closed) and cut off lengths $t_B$ (open) of switch 15 preferably roughly equal (to a line half-period $T_H/2$) and the regulation of the energy supplied to output stage 30 is done by causing the respective phases of the line return pulse $v_{220}(t)$ and the current $i_{21}(t)$ flowing through the power supply winding 21 of transformer 20 to vary as will be shown further on.

The operation of chopper circuit 10 (fed with D.C. voltage $V_A$) is in fact analogous to that of output stage 30, except as far as the form factor is concerned. This is determined mainly by the respective values of the inductance 16 (of choke 14 and the leakage inductance of winding 21 of transformer 20 connected in series) and of the capacity of tuning capacitor 13. The values $L_{16}$ and $C_{13}$ are chosen to obtain a half-period of oscillation slightly less than a line half-period, i.e.:

$$T_D = 2\pi \sqrt{L_{16} \cdot C_{13}} = 2\pi \sqrt{(L_{14} + L_{21}) \cdot C_{13}} < T_H,$$

because the oscillation of the resonant circuit $L_{16}$, $C_{13}$ occurs on one side and on the other of the D.C. voltage $V_A$ so that the cut off period of chopper switch 15 is greater than this half-period $T_D/2$.

This operation of circuit 10 will first be explained with reference to diagrams D and E in FIG. 2. When, at the instant $t=0$, transistor 11 becomes saturated by a preliminary positive polarization of its base-emitter junction, it connects terminal 19 to ground 8 so that a current $i_{16}(t)$ (dotted on diagram E), which is increasing linearly, $$(i_L = \frac{1}{L} \int_0^{t_6} v_L \cdot dt = \frac{V_A}{L_{16}} \int_0^{t_6} dt)$$

passes through inductor 16 coming from positive terminal 6 of power supply 5.

When transistor 11 receives from regulation circuit 40 a cut off voltage at an instant preceding instant $t_6$ of the storage time of minority charge carries, switch 15 opens and the current stored in inductor 16, $i_{16}(t_6) = V_A t_6/L = V_A \cdot T_H/4L$, will flow through tuning capacitor 13 in oscillatory fashion, i.e. cosinusoidally, decreasing to a zero value, while voltage $V_{19}$ at junction 19 of inductor 16 and capacitor 13 will increase sinusoidally to a maximum value, these two values coinciding in time. Then, capacitor 13 discharges through inductor 16 also in oscillatory fashion until, at instant $t_7$, voltage $v_{19}$ reaches a zero value, which corresponds to a minimum value, i.e. maximum negative, of current $i_{16}(t)$ whose absolute value is slightly less than the maximum positive value $i_{16}(t_6)$. The difference between the absolute peak values $i_{16}(t_6)$ and $i_{16}(t_7)$ is explained, on the one hand, by the ohmic losses in circuit 10 and, on the other, by the transfer of energy between this circuit and, in particular, output stage 30.

When oscillatory voltage $v_{19}(t)$ has exceeded the zero value slightly in the negative direction, diode 12 starts to conduct so as to connect terminal 19 to ground and produce in inductor 16 a current $i_{16}(t)$, which increases linearly from its maximum negative value $i_{16}(t_7)$ towards a zero value where transistor 11, which has already been polarized so as to be saturated, picks it up so that it reaches, at instant $t_8$, its maximum positive value of instant $t_6$ again.

It is to be noted here that the mean value of the wave form of voltage $v_{19}$ at terminal 19 is equal to the D.C. power supply voltage $V_A$ between terminals 6 and 7 of filter capacitor 4 in rectifier assembly 5.

If one wishes to obtain an adequate energy transfer between chopper circuit 10 and line sweep output stage 30, it is advantageous to choose the value of inductor 16 in series with power supply winding 21, i.e. the sum of the leakage inductance of this winding and that of series choke 14, so that it is, for example, greater than or equal to three times the inductance $L_{31}$ of the horizontal deviation coils 31, multipled by the square of the transformation ratio between windings 22 and 21, i.e. $L_{16} \geq 3 L_{31} (n_{11}/n_{21})^2$, and the value of this transformation ratio $n_{22}/n_{21}$ so as to obtain at the terminals of winding 21, during the forward sweep and the closing of switch 15, an induced voltage $v_{21}(t)$ whose amplitude is between 100 and 150 Volts, i.e. between a third and a half the power supply voltage $V_A$ at terminals 6, 7 of filter capacitor 4.

As the D.C. voltage $V_{221}$ at the terminals of capacitor 33 is a function of the inductance $L_{31}$ of the horizontal deviation coils 31 and, because of this, is between 50 and about 140 Volts, the transformation ratio $n_{22}/n_{21}$, i.e. between the numbers of turns $n_{22}$ and $n_{21}$ of windings 22 and 21 respectively, is between 1 and about 4 (preferably between 2 and 3).

The choice of these parameters is only given here as an example, because the criterion of this choice is a relative separation between chopper circuit 10 and, in particular, circuit 30 which it feeds, i.e. so that current $i_{21}(t)$ in winding 21 is only induced in winding 22 with peak amplitudes which do not exceed about one third those of sweep current $i_{31}(t)$ in order not to upset the operation of sweep circuit 30 during the conduction of recuperation diode 35. Also, the voltage pulses $v_{19}(t)$ of the diagrams (D) in FIGS. 2 and 3 should not appear at the terminals of winding 21 and should not be transmitted to winding 22 at least during the opening of sweep switch 36, 35 (line return interval) to winding 22 other than with amplitudes sufficiently small not to upset the operation of output stage 30 and the very high voltage rectifier fed by winding 23, while ensuring an energy transfer sufficient to obtain a regulated power supply voltage at the value required.

Transformer 20 may therefore be made in such a way as to have looser coupling between windings 21 and 22, the self-inductance then consists of that ($L_{14}$) of choke coil 14 and the leakage inductance ($L_{21}$) of winding 21. Hence it is advantageous, when one uses a ferrite core (magnetic circuit) of rectangular shape (in the form of a frame), to place windings 22, 23 and 24 on one of the arms of this core and winding 21 and, later, winding 25 on the other. This will also help provide good insulation between the primary and secondary grounds 8 and 39. The dimension of the air gap in the magnetic circuit of transformer 20 or a magnetic shunt, which fixes the leakage inductance $L_{21}$, and the inductance $L_{14}$ of the choke 14 are chosen with this result in view.

One may consider then that, from the point of view of the energy transfer from chopper circuit 10 to output stage 30, winding 21 is passed through by current $i_{21}$, which consists of triangular shaped current $i_{16}$ and the current in winding 22, which is induced in saw tooth form, superimposed one on the other and that voltage $v_{21}$, which appears at its terminals and is shown in diagrams (C) of FIGS. 2 and 3, is roughly analgous to that, $v_{220}$, at the terminals of sweep switch 35, 36 but with a mean value of zero.

The energy transmitted by transformer 20 will then be approximately equal to the product of voltage $v_{21}(t)$ and current $i_{21}(t)$ multiplied by the cosine of the phase angle if one considers the fundamental waves at the line frequency (15.625 Hz). This is also true for each of the harmonics of the current $i_{21}(t)$ and voltage $v_{21}(t)$ waves if one develops them in a Fourier series.

The energy ceded duuring each line period $T_H$ by chopper circuit 10 output stage 30 through transformer 20 may then be written:

$$E_H = \int^T H v_{21}(t) \cdot i_{21}(t) \cdot dt.$$

In inductor 16, as a first approximation, current $i_{21}(t)$ in a sum of an A.C. component $i_4(t)$ and a D.C. component $I_c$ and, considering that the losses of chopper circuit 10 itself are negligable, that the mean value of voltage $v_{21}$ is zero and that the D.C. component $I_c$ of $i_{21}$ does not take part in the energy transfer, one may write that the energy supplied by the D.C. source during this period $E_s = V_A \cdot I_C \cdot T_H$ and the A.C. energy supplied by chopper circuit 10, $$E_H = \int^T H v_{21}(t) \cdot i_4(t) \cdot dt$$

are roughly equal, i.e.

$$V_A \cdot I_C \cdot T_H = \int^T H v_{21}(t) \cdot i_4(t) \cdot dt) \cdot i_4(t).$$

from which it appears that there is a mean D.C. current $$I_C = \frac{1}{V_A \cdot T_H} \int^T H v_{21}(t) \cdot i_4(t) \cdot dt$$

supplied by source 5 which is a consequence of the exchange of energy between winding 21 and winding 22 in particular. The A.C. energy ceded, $E_H$, and, as a result, the D.C. current $I_c$ of source 5, varies as a function of the cosine of the phase angle $\alpha$ between each of the respective harmonics of the current $i_{21}(t)$ and voltage $v_{21}(t)$. Hence one can obtain regulation by causing the phase of the wave of current $i_{21}(t)$ to vary in power supply winding 21 with respect to that of voltage $v_{21}(t)$ at its terminals to stabilize the sweep (the peak to peak amplitude of current $i_{31}$) and/or the very high voltage by acting on the charge supplied to capacitor 33 during each cycle.

This is illustrated respectively on the diagrams (F) in FIGS. 2 and 3 showing the instantaneous power $E_i = -v_{21}(t) \cdot i_{21}(t)$ corresponding to two different phase angles between waves $v_{21}$ and $i_{21}$, which indicate respectively minimum (zero) energy transfers when the zeros of current $i_{21}$ coincide with the maxima of voltage $v_{21}$ or when the respective maxima of voltages $v_{21}$ and $v_{19}$ are out of phase by a half period $T_H/2$ and maximum energy transfers when the maxima of voltage $v_{21}$ and current $i_{21}$ coincide between circuit 10 and output stage 30.

On the diagram (F) in FIG. 2, one can see that, when there is a phase difference between the corresponding (positive) maxima of $v_{21}(t)$ and $i_{21}(t)$ of a quarter of a line period $(T_H/4)$ roughly, the energy transfer is zero, because there is equality between the surfaces bounded by the curve and the abscissa, which are respectively above and below it and give a mean value of zero as far as the energy supplied is concerned.

On the other hand, on the diagram (F) in FIG. 3 in which the product $-v_{21}(t) \cdot i_{21}(t)$ corresponds to a coincidence of phase between the respective maxima of voltage $v_{21}$ and $i_{21}$, one can see that, when one subtracts from the surfaces above the abscissa the surfaces corresponding to the shaded triangles below it, three zones remain on the positive side whose surfaces correspond to the energy which is effectively transferred whose mean value $$E_H = \frac{1}{T_H} \int^T H v_{21}(t) \cdot i_{21}(t) \cdot dt$$

is positive and shows an effective transfer of energy to output stage 30. This translates into a D.C. voltage $V_{33}$ at the terminals of capacitor 33 which forms, during the forward sweep (closing of switch 35, 36), the sole load on winding 22 (terminal 220 being connected to the ground 39).

Hence, one has shown above that, by causing the phase difference between the corresponding maxima of waves $v_{21}(t)$ and $i_{21}(t)$ to vary between 0 and $T_H/4$, one can cause the energy transmitted to vary and, as a result, the voltage $V_{221}$ at the terminals of capacitor 33 which feeds output stage 30.

When the relative phase difference between $v_{21}(t)$ and $i_{21}(t)$ exceeds a quarter of a line period, as, for example, when the negative peak amplitude of $v_{21}(t)$ coincides with the negative peak amplitude of $i_{21}(t)$, i.e. a phase difference equal to a line half period $(T_H/2)$, the term of the energy $E_H$ becomes negative which indicates that it is output stage 30 which feeds chopper circuit 10, or, more precisely, voltage source 5 (capacitor 4). This is not permanently possible unless it is output stage 30, and hence capacitor 33, which is fed by a rectifier assembly, thus showing the reversibility of the power supply device in accordance with the invention, which is contrary to classical chopper power supplies.

Hence, the regulation is done by causing the phase of the opening of switch 15 in chopper circuit 10 to be varied by the cutting off of transistor 11 with respect to the phase of the opening of sweep switch 36, 35, which is controlled by the line oscillator (not shown) and is generally slaved in frequency and phase to the line synchronizing pulses of the video complex signal.

Such a variable phase delay is obtained from line return pulses picked up on one of the windings of transformer 20, such as winding 21 itself or, as shown in FIG. 1, auxiliary winding 25. These pulses may trigger a monostable flip-flop whose length is variable as a function of the error voltage supplied by a comparator in the form of a differential amplifier, one of whose inputs receives a voltage corresponding either to the positive amplitude of $v_{21}(t)$, which is proportional to the voltage $V_{33}(V_{221})$ at the terminals of power supply capacitor 33 in output stage 30, or to the peak to peak amplitude of the line return pulse, which is proportional to the very high voltage, or to a combination of these two criteria. The other input of the differential amplifier receives a D.C. reference voltage, which may be adjusted, to allow the adjustment of the very high voltage and/or the horizontal sweep current amplitude.

It is to be noted here that power supply winding 21 may be connected between terminal 6 of capacitor 4 and choke 14 in two opposite directions so that the line return pulses can appear at its junction with choke 14 with opposite polarities. Two possibilities of the relative phase of voltage $v_{21}(t)$ respect to the current $i_{21}(t)$ in winding 21 result from this.

In FIG. 4, one has shown a partial block diagram (without a starting up device) of a simple way of making regulation circuit 40 which controls the cut off of transistor 11 in chopper circuit 10 with a delay which is variable with respect to the line return pulse as a function of the negative peak amplitude of the signal $v_{25}(t)$ supplied by auxiliary winding 25 of transformer 20.

Regulation circuit 40 in FIG. 4 is fed at its first input 401 with signal $v_{25}(t)$ supplied by one of the terminals 250 of auxiliary winding 25. This signal is roughly the reverse of signal $v_{21}(t)$ illustrated by the diagrams (C) respectively in FIGS. 2 and 3 in which one distinguishes, during each line period, a line return pulse of positive polarity and a negative plateau whose amplitude is proportional to D.C. voltage $V_{33}$ at the terminals of capacitor 30. This first input 401 feeds, through a first diode 410, the triggering input 411 of a first monostable flip-flop 41 of variable length, which produces at its output 413, in response to the leading edge of the return pulse, a rectangular signal whose length varies as a function of the D.C. voltage applied to its length control input 412.

Monostable flip-flops with a pulse length variable as a function of a D.C. voltage are known and a way of making them is described, for example, in French patent application No. 73.16116 made on May 4, 1973 by the present applicant.

This D.C. voltage controlling pulse length is obtained by means of a rectifier assembly 42, which is also fed by this first input 401 and contains a second diode 420 so connected as to conduct only while signal $v_{25}(t)$ is negative, a capacitor 421 in series with diode 420 which stores the negative peak values of $v_{25}(t)$, a resistive potentiometric divider assembly 422, 423 mounted in parallel with capacitor 421 and a polarity reverser 424 fed by the centre point of divider 422, 423 and supplying a positive voltage of the same level in reply to a negative input voltage, the respective terminals of capacitor 421 and divider 422, 423, which are not connected to diode 420, being connected together to primary ground 8.

The positive voltage proportional to $V_{33}$ supplied by reverser 420 feeds a first input 431 receives a stabilized reference voltage, for example, by means of an assembly 44 fed with the mains voltage $V_6$, rectified and filtered, through a second input 402 of circuit 40. This assembly 44 contains a resistor 440 and a Zener diode 441 connected in series between the input 402 and primary ground 8 and it supplies, by means of a resistive divider assembly 442, which may be adjustable and is connected in parallel with Zener diode 441, the reference voltage to input 432 of comparator 43. The output 433 of comparator 43, which is connected to the control input 412 of the first monostable flip-flop 41, supplies it with a voltage proportional to the difference between the voltages which are applied respectively to its inputs 431 and 432 so as to cause the delay in the cut off of chopper transistor 11 to vary with respect to that of sweep transistor 36 (FIG. 1) in order to stabilize the D.C. power supply voltage $V_{33}$ of output stage 30.

The leading edges of the pulses supplied by output 413 of flip-flop 41 coincide roughly with those of the line return pulses and their rear or falling edges, which occur with variable delays with respect to the leading edges, are used to trigger, eventually through an inverter stage 450, a second monostable flip-flop 45 whose output feeds the base of chopper transistor 11 to cut it off. This second monostable flip-flop 45 supplies this base with negative rectangular signals at the line frequency, of constant length, which is greater than the half period of oscillation of resonant circuit 13, 15 and hence the half period ($>T_H/2$) and less than three quarters of this same period ($<3T_H/4$) so as to allow transistor 11 to accept the current $i_{16}(t)$ flowing through inductor 16 when the current in diode 12 disappears.

FIG. 5 is a block diagram of a preferred production model of a regulation circuit 40 (in FIG. 1) controlling transistor 11 of chopper circuit 10 in accordance with the invention.

In FIG. 5 regulation circuit 40 has an input 401 connected to one of the terminals of auxiliary winding 25 of line transformer 20 which feeds in parallel a first control input 461 of a phase shift stage 46, the input of a regulator stage 47 and, finally, the input of a synchronizing circuit 49. The output of regulator stage 47 feeds a second regulation input 462 of phase shift stage 46, these two stages 46, 47 forming together a variable delay generator. The output of phase shift stage 46 feeds a first triggering input 481 of an unstable multivibrator 48 whose second synchronizing input 482 is fed by the output of synchronizing circuit 49. This synchronizing circuit 49, whose operation will be described further on, is only necessary if the free running oscillation frequency of multivibrator 48 is greater than the line frequency. If this is not so, multivibrator 48 is synchronized in classical fashion by the triggering pulses applied to its input 481. The output of unstable multivibrator 48 feeds the input of a driver or control stage 50 formed by an amplifier. The output of control stage 50 (called a "driver" in anglo-american litterature), which is connected to output 402 of regulation circuit 40, feeds the base of transistor 11 in chopper circuit 10.

Auxiliary winding 25 supplies to input 401 of the regulation circuit a voltage wave form containing the line return pulses with a negative polarity, for example, similar to that shown in the diagrams (C) of FIGS. 2 and 3. These line return pulses, when applied to input 461 of phase shift stage 46 or the delay generator, control the triggering of a signal generator which supplies a voltage in the form of a positive saw tooth that is applied to one of the inputs of a voltage comparator stage whose other input is fed with a fixed reference voltage and which switches from its "high" state to its "low" state when the amplitude of the saw tooth voltage exceeds the value of the reference voltage. Regulation stage 47 also receives the line return pulses, rectifies them and transmits to regulation input 462 of phase shift stage 46 a signal in the form of a current which enables the slope of the saw tooth to be modified as a function of the amplitude of the line return pulse which is a function of the D.C. voltage at the terminals of power supply capacitor 33 (FIG. 1) in output stage 30. To obtain regulation of voltage $V_{33}$, the phase shift must increase with the value of this voltage to regulate the transfer of energy between circuits 10 and 30. As a result, the slope of the saw tooth must decrease with the increase in amplitude of the return pulse. The comparator stage of phase shift circuit 46 feeds triggering input 481 of unstable multivibrator 48 to trigger it with a variable phase shift with respect to the leading edge of the return pulse, which corresponds to the energy transfer desired. Unstable multivibrator 48 is, preferably, synchronized in frequency with line sweep output stage 30 in a way which will be explained later by means of synchronizing circuit 49 which feeds its synchronizing input 482. The output of multivibrator 48 feeds the input of driver stage 50 for chopper transistor 11.

To enable the chopper circuit 10 to start up before the line sweep circuit is running and, in particular, its output stage 30, unstable multivibrator 48 must oscillate independantly and stage 50 must amplify the roughly square wave signal it supplies. For this purpose, an independant D.C. power supply voltage source 51 is connected to supply terminals 1, 2 of the A.C. mains and the voltage it supplies feed supply terminals 403, 404 and 405 of regulation circuit 40. When chopper circuit 10 starts operating independantly when the line sweep circuit containing in series a line oscillator, a driver stage and output stage 30 is not being fed, the chopper current $i_{16}(t)$ passing through power supply winding 21 is induced in winding 22 and it is rectified by the second diode 35 which charges positively power supply capacitor 33 which then also feeds the other stages of the sweep circuit with a D.C. voltage so that they start up. This starting up and the resulting regulation will be explained more in detail in what follows.

FIG. 6 is a theoretical schematic diagram of the preferred production model of regulation circuit 40 whose block diagram was shown in FIG. 5.

In FIG. 6, power supply voltage source 51 of regulation circuit 40 contains a rectifier assembly 52 of the voltage doubler type operating on a half wave with two diodes 521, 522 in series. The first diode 521 is connected by its anode to the second terminal 2 of the supply from the mains, which is connected to the primary ground 8 and by its cathode to the anode of the second diode 522 whose cathode is connected to the positive plate of a first chemical filter capacitor 523. The negative plate of the first filter capacitor 523 is connected to the anode of the first diode 521 and hence also to primary ground 8. The junction of the cathode of first diode 521 and the anode of second diode 522 is coupled to the first terminal 1 of the power supply from the mains through a coupling capacitor 520 which transmits to the rectifier assembly 52 the mains voltage and whose capacity is chosen as a function of the D.C. voltage desired (the voltage drop at the terminals of this capacity 520 of the order of a few microfarads makes it possible to obtain a rectified and filtered voltage of about 15 Volts). The junction of the positive plate of first filter capacitor 523 is connected to the positive plate of a second filter capacitor 524 through a resistor 525, the negative plate of this second capacitor 524 being connected to primary ground 8. The positive terminal of this second capacitor 524 supplies a first rectified and filtered voltage $V_F$, on the one hand, through the first output terminal 510 of source 51 to the first positive power supply terminal 404 of regulation circuit 40 and, on the other hand, to a stabilizing assembly 53 containing in series a resistor 531 and a Zener diode 530 whose anode is connected to primary ground 8. The junction of resistor 530 with the cathode of Zener diode 530 is connected to the second output 511 of source 51, which supplies a second regulated voltage $V_R$ that feeds the second power supply input 403 of regulation circuit 40.

The first power supply input 404, which supplies a first voltage $V_F$ (15 V) that is higher than the second regulated voltage $V_R$ (5 V), only feeds control stage 50 of chopper transistor 11. Control stage 50 contains in series a phase shift stage 500 (called a "phase splitter" in anglo-american litterature) and an output stage 550 of the "series push-pull" type often used in integrated logic circuits of the TTL type. Phase splitter 500 contains a first NPN transistor 501 whose collector is connected through a collector resistor 502 to the first power supply input 404 and whose emitter is connected through an emitter resistor 503 to primary ground 8 through the third power supply terminal 405 of circuit 40. The base of transistor 501 is connected to the output of unstable multivibrator 48 through a diode 504 and to the second power supply input 403 through a polarizing resistor 505. Output stage 550 contains a second and third NPN transistors 551 and 552. The collector of the second transistor 551 is connected through a resistor 553 to the first power supply input 404, its base being connected to the collector of the first transistor 501. The emitter of the second transistor 551 is connected to the anode of a diode 554 whose cathode is connected to the collector of the third transistor 552. The base of the third transistor 552 is connected to the emitter of the first 501 and its emitter, through the third power supply terminal 405, to primary ground 8. The junction of the cathode of diode 554 with the collector of third transistor 552 is connected to the cathode of a Zener diode 555 and to the positive plate of a chemical capacitor 556, mounted in parallel to form a "battery" which facilitates the cutting off of switching transistor 11. The other terminal of the parallel assembly 555, 556 is connected, through an inductor 557 (choke) to the output 402 of regulation circuit 40, which feeds the base of switching transistor 11.

Control stage 50 is controlled by an unstable multivibrator 48 of the symmetrical type containing two NPN transistors 480, 483 mounted with their emitters common, i.e. with their emitters connected through the third power supply terminal 405 to primary ground 8. The collectors of the two transistors 480, 483 are connected respectively to the second power supply input 403, which receives the stabilized voltage $V_R$, through two collector resistors 484, 485. The bases of the two transistors 480, 483 are connected respectively by means of two polarizing resistors 486, 487 also to the second power supply input 403. The base of first transistor 480 is also coupled to the collector of second transistor 483 through a first capacitor 488 and the base of second transistor 483 is coupled to the collector of the first 480 through a second capacitor 489. The respective values of the polarizing resistors 486, 487 and of the mutual coupling capacitors 488, 489 (crossed) of the two stages mounted with their emitters common determine, with the value of the stabilized power supply voltage $V_R$, the lengths of the half periods of relaxation of multivibrator 48 whose sum (60 μsec) is chosen, preferably, less than that of a line period (64 μsec).

In the absence of line return pulses coming from the line sweep output stage 30 through auxiliary winding 25, multivibrator 48 is fed neither at its triggering input 481, which is connected to the cathode of a first diode 4802 whose anode is connected to the base of the second transistor 483, nor at its synchronizing input 482 which is connected to the cathode of a second diode 4803 whose anode is connected to the base of the first transistor 480. It will operate independantly then as soon as voltage is applied to the mains power supply terminals 1, 2 which feed, on the one hand, rectifier assembly 5 and, on the other, independant power supply 51. The power supply then provides multivibrator 48 with a stabilized power supply voltage $V_R$ and the driver stage 50 with a rectified filtered voltage $V_F$. When multivibrator 48 starts to oscillate, it supplies at its output formed by the collector of its second transistor 483 rectangular signals of two levels ($V_R$ and $V_{CEsat}$), the lowest of which, through coupling diode 504, causes the cut off of the first transistor 501 in control stage 50. When the first transistor 501 is cut off, the base of the second transistor 551 in output stage 50 is connected, through the collector resistor 502, to the first power supply input 404 in circuit 40 so as to saturate it. The emitter current of second transistor 551 then passes, through the diode 554, the Zener diode 555 and inductor 557 (which limits the rate of rise of the current di/dt), in resistor 19 connecting the base of chopper transistor 11 to primary ground 8 and in this base in order to allow the saturation of chopper transistor 11, the third transistor 552 then being cut off by the cut off of the first 501. The voltage drop at the terminals of Zener diode 555 enables the positive polarizing voltage of the base to be reduced and the capacitor 556 to be charged to the Zener voltage $V_Z$ during its periods of conduction.

When the second transistor 483 of multivibrator 48 has switched from its saturated to its cut off state, its collector voltage is equal to the stabilized voltage $V_R$ and diode 504 cuts off. The base of first transistor 501 in control stage 50 is then connected to the second power supply input 403 ($+V_R$) through resistor 505, which causes it to saturate. Then the emitter current of this first transistor 501 feeds the base of the third transistor 552 which also becomes saturated while the second transistor 551, whose base is at a voltage ($V_{CEsat\ 501}+V_{BE\ 552}$), which is roughly equal to that of its emitter ($V_{F\ 554}+V_{CEsat\ 552}$), cuts off. The saturation of the third transistor 552 first brings the base of chopper transistor 11 to a negative voltage with respect to its emitter $V_{BE\ 11}=-V_Z+V_{CEsat\ 552}$ so as to cut it off rapidly by a rapid evacuation of the minority carriers in its base, this voltage $V_{BE\ 11}$ then tending asymptotically to zero because the capacitor 556 discharges through resistor 19 and the third transistor 552 saturated. Chopper transistor 11 will remain cut off during the whole half period of oscillation of the resonant circuit $L_{16}$, $C_{13}$ and will only accept the current of diode 12 afterwards if it is already positively polarized on its base by the switching of multivibrator 48 to the state in which its second transistor 483 again becomes saturated so as to cut off first transistor 501 and again saturate second transistor 551 in control circuit 50.

The alternate cut off and conduction of bidirectional switch 15 causes the appearance at terminal 19 of recurrent half sinusoids of voltage, shown by the diagrams (D) in FIGS. 2 and 3, a fraction of which is also present at the terminals of power supply winding 21 of line transformer 20, from where they are transmitted with a phase inversion (polarity) but without a D.C. component to winding 22 of line sweep output stage 30. The negative half cycles of its wave forms on terminal 220 of the winding are then rectified by the parallel ("shunt") recovery diode 35 whose current charges power supply capacitor 33 until the voltage $V_{33}$ on terminal 221, which feeds the whole of the line sweep circuit, is sufficient for the line oscillator (which is not shown) to start oscillating independantly, so as to control, through the driver stage (not shown), switching transistor 36 in output stage 30. Line sweep output stage 30 then starts to supply, at the terminals of winding 22 of line transformer 20, line return pulses $v_{220}(t)$, which are illustrated by the diagrams (B) in FIGS. 2 and 3. These pulses are transmitted to auxiliary winding 25 without a D.C. component and with (negative) phase inversion so as to have a wave shape analogous to that of the diagrams (C) in FIGS. 2 and 3, which makes possible first the synchronization of multivibrator 48 with the line oscillator frequency using an original slaving device which will be described further on and then the regulation of voltage $V_{33}$ by varying the delay between the leading edges of the line return pulses and the instant when chopper transistor 11 in switch 15 is cut off.

When multivibrator 48 and the line oscillator operate independantly and at different frequencies, this produces a beat because there are random phase variations between the line return pulses, $v_{220}(t)$ or $v_{21}(t)$, and the wave form of the chopper voltage $v_{19}(t)$, so that the energy supplied (or consumed) by chopper circuit 10 to (or from) output stage 30 varies from one cycle to another. This has as visible result a more or less big fluctuation in the amplitude of the line return pulses $v_{220}(t)$ which seem to be modulated in amplitude by a sinusoidal signal whose frequency is equal to the difference between that of multivibrator 48 and that of the line oscillator.

If one chooses to synchronize unstable multivibrator 48 in classical fashion soleby by means of periodic control pulses derived from the line return pulses through a variable delay circuit allowing regulation, it is sufficient for the independant oscillation frequency to be less than that of the line oscillator. One then obtains on starting up peak voltages $V_{19}$, which are higher (overvoltages) on the collector of transistor 11 when it is cut off because, in the formula $V_{19max} \cdot t_B = V_{Amax} \cdot T_{48A}$, in which $V_{19max}$ is the peak amplitude of the collector voltage (on terminal 19), $t_B$ the time during which switch 15 is cut off, $V_{Amax}$ the maximum supply voltage supplied by rectifier 5 and $T_{48A}$ the free running period of multivibrator 48, $T_{48A}$ being greater than $T_H$. If one accepts this overvoltage $V_{19max}$ and limits it by a choice of the saturation time $t_S$ slightly higher than the cut off time $t_{B1}$ which is always equal to the half period of oscillation of $L_{16}$ and $C_{13}$, it will not be necessary to slave multivibrator 48 before regulation and synchronizing circuit 49 can be omitted.

If, on the other hand, one wishes to avoid the excesses of the collector peak voltage $V_{19max}$ on starting up, one chooses a free running period $T_{48A}$ for multivibrator 48 less than the line period $T_H$ (64 μsec) and one synchronizes by acting only on the length of the cut off state of first transistor 480 in multivibrator 48 by lengthening it. During this same time interval, second transistor 483 of multivibrator 48 and second transistor 551 of driver stage 50 are saturated and the first 501 and third 552 transistors of this stage 50 are cut off so that the base of chopper transistor 11 is polarized to conduct.

This lengthening is done by means of a network 49 containing a diode 490 whose cathode is connected to the input 401 of regulation circuit 40 which receives the line return pulses from winding 25 with negative polarity and no D.C. component. The anode of diode 490 is connected to that of a Zener diode 491 whose cathode is connected to one of the terminals of a first resistor 492. The other terminal of this first resistor 492 is connected, on the one hand through a second resistor 493, to the synchronizing input 482 of unstable multivibrator 48 and, on the other hand through a third resistor 494, to the collector of the second transistor 483 in the multivibrator so that the line return pulse, negative and with its base cut off by Zener diode 491, cannot act on the base of the first transistor 480 during its periods of saturation so as to cut it off at the wrong time.

The process of slaving the frequency of multivibrator 48 by means of the line return pulses is shown by the diagrams of the wave forms in FIG. 7.

In FIG. 7, the diagram A represents the wave form at the terminals of auxiliary winding 25 of the line transformer 20 where line return pulses appear in the form of negative half sinusoids of amplitude $V_{25}$ at the line frequency (15.626 Hz). The diagram B shows the wave form of the voltage $v_{BE\,480}$ on the base of the first transistor 480. This wave form contains a first time interval $t_{SA}$ during which chopper switch 15 is conducting and transistor 480 is cut off. This time interval depends solely on the value of the components connected to this base, specifically the resistor 486 and the capacitor 488 and the supply voltage $V_R$ for this resistor 484. This wave form also contains a second time interval $t_B$ of fixed length during which chopper switch 15 is cut off and transistor 480 saturated. The sum of the intervals $t_{SA}$ and $t_B$ represents the period of independent operation $T_A$ of multivibrator 48 (of the order of 58 μsec for example).

In FIG. 7 the first three periods of free running operation of multivibrator 48 are not changed because either the line return pulse occurs outside the cut off interval $t_{SA}$ of transistor 480 or its amplitude, with its base cut off by Zener diode 491 and reduced by the resistive voltage divider 492, 494, i.e. $(V_{25} - V_{Z\,491}) \cdot R_{494}/(R_{492} + R_{494})$, is less in absolute value than the instantaneous base-emitter voltage $v_{BE\,480}(t)$. From the instant at which the cathode of the separator diode 4803 becomes more negative than its anode, which is connected to the base of transistor 480, it begins to conduct a current $I_{493}$ which discharges capacitor 488 through the resistor 493 in series with the resistors 492 and 494 in parallel. Current $I_{493}$ must be subtracted from the current $I_{486}$, which is charging the capacitor, during the whole of the time the amplitude of the line return pulse exceeds the voltage $v_{BE}$. The effect of this is to shift in time a part of the charging wave form of capacitor 496 and thus lengthen the cut off time $t_{SA}$ of transistor 480 by a time $\Delta t_S$ which will increase until the lengthened period of multivibrator 48 is equal to the line period $T_H$. Because the conduction time of switch 15 is lengthened, the energy stored in inductor 16 increases. This increases the voltage $V_{33}$ and the amplitude of the line return pulse.

The process of slaving multivibrator 48 in frequency must of necessity lead to equality of these periods because an inequality gives rise to a variation in the peak amplitude of the line return pulse in a direction which affects the length of cut off time $t_{SA} + \Delta t_S$ of transistor 480 in the opposite direction.

After the slaving of the frequency of unstable multivibrator 48 one can go on to the regulation by varying the phase shift between the respective cut off instants of the sweep transistor 36 and chopper transistor 11 by means of the phase shift 46 and regulator 47 stages in regulation circuit 40, which together form the variable delay generator.

Phase shift stage 46 contains a saw tooth generator which includes a first capacitor 460, one of whose terminals is connected to primary ground 8 while the other terminal is connected to one of the terminals of a first resistor 463 whose other terminal is connected to the second power supply input 403 which receives the stabilized voltage $+V_R$, and a switch, which is intended to short-circuit the first capacitor 460 periodically. This switch contains a first NPN switching transistor 464 whose collector is connected to the junction of first capacitor 460 and first resistor 463, its emitter being connected to primary ground 8 and its base, through a second resistor 465, to the second power supply input 403 and, through a third resistor 466, to the anode of a diode 467, whose cathode is connected to the control input 461 of phase shift stage 46 which receives negative line return pulses from input 401 of circuit 40. The base of first transistor 464 is also coupled to primary ground 8 through a second capacitor 468.

When input 401 of circuit 40 receives a negative line return pulse, diode 467 starts to conduct and its current causes voltage drops at the terminals of resistors 465, 466 in series which brings transistor 464 to cut off by polarizing it negatively. Second capacitor 468 then charges to a negative voltage which will extend the length of the cut off of transistor 464 beyond the disappearance of the line return pulse for a part of the forward sweep period in order to have a sufficient regulation range available.

When the negative return pulse ceases, diode 467 cuts off and second capacitor 468 is charged gradually through resistor 465 to a positive voltage $V_{BE}$ of about 0.7 Volts, at which transistor 464 becomes saturated and discharges first capacitor 460.

During the cut off period of first transistor 464, first capacitor 460 is charged almost linearly through resistor 463 and supplies a voltage of positive saw tooth shape to the base of a second NPN transistor 469, whose collector is connected, through a fourth resistor 4600, to the second power supply terminal 403 ($V_R = +5$ V). The emitter of second transistor 469 is connected, on the one hand, to the cathode of a Zener diode 4601 whose anode is connected to primary ground 8 and, on the other hand, to the second power supply terminal 403 through a fifth resistor 4602 which makes it possible to polarize the emitter of second transistor 469 at a fixed voltage $V_Z$ (between 2 and about 3 Volts).

Second transistor 469 forms, with resistors 4600, 4602 and Zener diode 4601, an analog voltage comparator stage which is cut off until the voltage applied at its base exceeds a threshold voltage resulting from the addition of Zener voltage $V_Z$ of diode 4601 to the voltage $V_{BEm}$ of about 0.7 Volts at which second transistor 469 saturated.

When second transistor 469 passes from its cut off state to its saturated state, its collector voltage $v_{C\,469}$ changes from $V_R$ to $V_Z + V_{CEsat}$. This negative change is transmitted through a coupling capacitor 4603 to the triggering input 481 of unstable multivibrator 48 which is connected, on the one hand, to the cathode of the first diode 4802 whose anode is connected to the base of the second transistor 483 and, on the other hand, to the first terminals of two resistors 4800 and 4801 which form a resistive voltage divider and whose second terminals are respectively connected to primary ground 8 and to the second power supply terminal 403 of circuit 40. This negative change, when transmitted to the base of second transistor 483 in multivibrator 48, causes it to cut off and, in the manner already described, the coppice of chopper transistor 11 also.

The regulation of the power transmitted by chopper circuit 10 to line sweep output stage 30 is obtained by the variation of the phase shift between the respective cut off instants of the sweep 36 and chopper 11 transistors by means of the regulator stage 47 which causes the charging voltage slope of the capacitor 460 to vary as a function of one of the parameters contained in the line return pulse.

The combined operation of the phase shift 46 and regulator 47 stages will be explained by means of FIG. 8, which illustrates the voltage wave forms at three points of these circuits 46, 47.

Regulator stage 47 contains a diode 470 whose cathode is connected to the input 401 of circuit 40, which receives the negative polarity line return pulses and whose anode is connected to the negative plate of a filter capacitor 471 and to one of the terminals of a resistive voltage divider containing a potentiometer 472 between two resistors 473, 474 in series and to the anode of a Zener diode 475. The cathode of Zener diode 475 is connected, on the one hand, to one of the terminals of a third resistor 477 whose other terminal is connected to primary ground 8 and, on the other hand, to the emitter of an NPN transistor 476 whose base is connected to the slider arm of potentiometer 472 and whose collector is connected to the regulation input 462 of the phase shift stage 46, which is connected to the junction of its first capacitor 460 with its first resistor 463 and the collector of its first transistor 464.

Diode 470 forms with capacitor 471 a rectifier of the negative peaks of the line return pulses, capacitor 471 supplying at its terminals a voltage which is a function of the negative peak amplitude of the line return.

This rectified peak voltage is applied, on the one hand, to the resistive divider assembly, 472-474, so that the slider arm of potentiometer 472 supplies a voltage which is a predetermined adjustable fraction of that voltage and, on the other hand, to the series assembly of Zener diode 475 and resistor 477 which polarizes this diode 475. As soon as the amplitude of the line return pulses exceeds the Zener voltage $V_Z$ of diode 475, it is opened up so as to supply at its cathode a voltage equal to the difference between the rectified peak voltage and the Zener voltage $V_Z$. The cathode voltage of Zener diode 475 polarizes the emitter of transistor 476 whose base is polarized by divider assembly 472-474 and which starts to conduct as soon as the fraction of the rectified voltage supplied by the slider arm of the potentiometer is greater than the Zener voltage $V_Z$ in absolute value. Transistor 476 then forms a source of constant current proportional to its base-emitter voltage $V_{BE}$, i.e. to $V_B-V_Z$ when the latter is positive. The collector current of transistor 476 is therefore a current which discharges capacitor 460 during the intervals when transistor 464 is cut off so as to reduce the slope of the saw tooth voltage at the terminals of capacitor 460. The bigger the negative peak voltage of the line return pulses, the more the collector current of transistor 476 reduces the slope so as to increase the delay time between the leading edge of the line return pulse and the instant of change of the comparator transistor 469 from its cut off to its saturated state.

This is indicated in FIG. 8, in which the diagram (A) shows the voltage wave form $v_{25}(t)$ at the terminals of auxiliary winding 25 whose line return pulses are of three different amplitudes $V_{25B}$, $V_{25F}$ and $V_{25N}$, the diagram (B) represents the voltage wave form at the terminals of capacitor 460 corresponding to these three line return pulses and the diagram (C) represents the collector voltage $v_{469}(t)$ of comparator transistor 469.

In diagram (A) in FIG. 8, the first line return pulse is of a relatively small amplitude $V_{25B}$ which does not cause the conduction of regulation transistor 476. To this corresponds in diagram (B) the steepest slope of the voltage wave $v_{460}(t)$ which starts at the instant $t_1$ of cut off of first transistor 464 in phase shift circuit 46 and the shortest length $T_B = t_2-t_1$ of this cut off because of the smaller negative charge of capacitor 468. At the instant $t_2$, when voltage $v_{460}(t)$ becomes equal to $V_Z + V_{BEm}$, it no longer increases because the diode formed by the base-emitter junction of second transistor 469 limits the maximum level of this voltage and transistor 469 becomes saturated. This is illustrated by the diagram (C) in FIG. 8, in which one can see that the collector voltage $v_C$ 469 of second transistor 469 contains a negative square wave whose level is equal to $V_Z + V_{CEsat}$ and which lasts until the instant $t_3$ of the opening up of the first transistor 464 which discharges capacitor 460 and, as a result, cuts off second transistor 469.

Because of the small phase delay $t_{RB} = t_2-t_1$ produced by the fast rise of the voltage $v_{460}(t)$, chopper circuit 10 supplies maximum energy to output stage 30 in the form of a high voltage $V_{33}$ at the terminals of the power supply capacitor 33. As a result, the next line return pulse will be of large amplitude $V_{25F}$. The comparator transistor 476 starts to conduct as soon as $V_{BE}$ becomes positive and the greater the amplitude $V_{25F}$ to which the capacitor 471 charges, the greater the collector current. This collector current is to be subtracted from the charging current of capacitor 460 through the resistor 463. Hence, it causes a noticeable reduction in the slope of the rise in the voltage $v_{460}(t)$ which occurs between the instants $t_4$ and $t_5$. The length of this rise, which corresponds to the phase delay $t_{RF} = t_5-t_4$, will then be noticeably longer than before as well as the length of the cut off state $T_F$ of the first transistor 464. One can see then in the three diagrams that, when $V_{25F}$ is large, the delay $t_{RF}$ is longer and the length of the negative pulse $T_F-t_{RF}$ is slightly shorter.

This longer delay causes a reduction in the voltage $V_{33}$ compared with the preceding cycle in which it was too big and the next line return pulse (the third) will be of an amplitude $V_{25N}$ greater than $V_{25B}$ and less than $V_{25F}$. It will make it possible to obtain, by means of the corresponding collector current of the regulation transistor 476, a slope in which the rise from a voltage $V_{CEsat}$ near zero to a voltage $V_Z + V_{BEm}$ is of a length equal to $t_{RN} = t_7-t_6$. If the slider arm of potentiometer 472 has been so placed that the power supply voltage $V_{33}$ makes it possible to obtain a very high voltage for the cathode ray tube (which is not shown) and/or an amplitude of the horizontal sweep current saw tooth corresponding to their respective nominal values, the nominal amplitude $V_{25N}$ of the line return pulse will be reproduced afterwards in recurrent fashion.

It is to be noted here that one can also use as a regulation criterion the positive amplitude of the signal $v_{25}(t)$, i.e. the positive plane whose level is proportional to the power supply voltage $V_{33}$ by using an analog phase inverter or another winding of line transformer 20 for example.

One will note also here that the main advantage of the regulation by the phase shift of a chopper circuit operating with a constant cyclic ratio and frequency, compared with that by the variation of one of them, is formed by the fact that the peak voltage applied to the collector of the chopper transistor, when it is cut off, is a function only of the mains voltage.

We claim:

1. A regulated power supply device, in particular for a line sweep circuit in a television receiver, whose output stage (30) contains a first electronic switch of the bidirectional type (36, 35), controlled periodically so as to be closed during the forward sweep and open during the fly-back, connected in parallel with a first series assembly containing line deviation coils (31) and a first capacitor (32), called the forward capacitor, which feeds these coils (31) during the closing of the first switch (36, 35), with a second capacitor (34), called the return capacitor, which forms a parallel resonant circuit with the inductance in particular of the coils (31) during the opening of the first switch (36, 35) and with a second series assembly containing a first winding (22) of a transformer (20), called the line transformer, and a third capacitor (33), called the power supply capacitor, which feeds the first winding (22) with D.C. voltage while the first switch (36, 35) is closed, the power supply device containing a chopper circuit (10) connected between the terminals (6, 7) of a D.C. power supply voltage source (5) and containing an inductor, called the chopper inductor, (16) and a second electronic switch (15), which is controlled, mounted in series, this second switch (15) containing a chopper transistor (11) controlled on its base by means of a recurring control signal, which is produced by means of the line return pulses picked up on a secondary winding (25) of the line transformer (20), in order to be alternately conducting and cut off during each line period, this chopper inductor (16) containing a second winding (21), called the power supply winding, of this transformer (20), which is intended for the transfer of energy between the chopper circuit (10) and the line sweep output stage (30), and being characterized by the fact that, the second switch (15) being also of the bidirectional type and containing, apart from the chopper transistor (11), which is operating in the saturated and cut off mode, a diode (12) mounted in parallel and in opposition with this transistor, the chopper circuit (10) contains also a fourth capacitor (13), called the turning capacitor, which forms a resonant circuit with the chopper inductor (16) during the opening periods of the second switch (15) which works with a constant cyclic ratio, the periods being obtained by means of a control signal which causes the cutting off of the chopper transistor (11) and their lengths being constant and greater than a half period of resonance of this resonant circuit (13, 16) whose length may reach about a half of a line period, and by the fact that the regulation of the energy exchanged between the chopper circuit (10) and the output stage (30) is obtained by the variation of the delay between the respective opening instants of the first (36, 35) and second (15) switches.

2. A power supply device as in claim 1, characterized by the fact that the transistor (11) in the second switch (15) is controlled by means of a regulation circuit (40) fed by an auxiliary winding (25) of the transformer (20) which supplies it with a signal one of whose peak amplitudes is proportional to the voltage at the terminals of the power supply capacitor (33) in the output stage (30), which is recharged by means of the chopper circuit (10), and whose peak to peak amplitude is proportional to a very high voltage supplied by another winding (23) of transformer (20), the regulation circuit (40) causing the delay in the instant of cut off of transistor (11) to vary with respect to the leading edge of the line return pulse produced by the opening of the first switch (36, 35).

3. A power supply device as in claim 2, characterized by the fact that the regulation by the phase shift between the respective cut off instants is obtained as a function either of the peak to peak amplitude or of the peak amplitude during the fly back or forward sweep of the signal at the terminals of one of the windings (21 or 25) of line transformer (20) by comparing this amplitude to a reference voltage and by controlling the delay as a function of the difference between the voltage corresponding to one of these amplitudes and the reference voltage, in order to stabilize either the sweep amplitude or the power supply voltage obtained by rectifying the line return pulse.

4. A power supply device as in claim 2, characterized by the fact that the regulation circuit (40) contains an unstable multivibrator (48) whose output is coupled to the base of chopper transistor (11) by means of a control stage (50) and which operates independantly on starting up, a circuit generating a variable delay which contains a phase shift stage (46) triggered by the line return pulses and supplying to the multivibrator (48) triggering pulses which are delayed with respect to the leading edges of the line return pulses, which cause the cutting off of chopper transistor (11), and a regulator stage (47), which supplies the phase shift stage (46) with a regulation signal that makes it possible to vary the delay between the respective leading edges of the line return pulses and the triggering pulses as a function of one of the peak amplitudes or of the peak to peak amplitude of the signal supplied by the auxiliary winding (25) of the transformer (20).

5. A power supply device as in claim 4, of the type in which the power supply capacitor (33) feeds a D.C. voltage to the whole line sweep circuit, characterized by the fact that the regulation circuit (40) is fed by means of an independant power supply circuit (51) which enables the chopper circuit (10) to be started up by the independant operation of the unstable multivibrator (48) in order to start up the power supply of the line sweep circuit with the chopper voltage induced in the first winding (22) of the transformer (20) and rectified by the diode (35) which is part of the first bidirectional switch (36, 35) which charges the power supply capacitor (33).

6. A power supply device as in one of claims 4 and 5, characterized by the fact that the phase shift stage (46) contains a delay generator which supplies a voltage, in the shape of recurrent saw teeth (460, 463) which are triggered by the leading edges of the line return pulses, to an analog voltage comparator stage (469, 4600, 4601), which supplies at its output negative pulses to the base of the transistor (483) in multivibrator (48) whose cutting off controls the cut off of chopper transistor (11) at instants at which the instantaneous saw tooth amplitude exceeds a fixed threshold voltage ($V_{Z\,4601}$), and by the fact that the regulator stage (47) contains an assembly (470, 471) rectifying the signal supplied by the auxiliary winding (25) which feeds a signal generator (476, 475) supplying a signal which modifies, from a predetermined threshold, the saw tooth slope as a function of one of the peak amplitudes or peak to peak amplitudes of this signal ($v_{25}$).

7. A power supply device as in claim 6, of the type in which the free running operating frequency of the unstable multivibrator (48) is less than the line frequency, characterized by the fact that the unstable multivibrator (48) is controlled solely by the negative pulses coming from the comparator stage (469), which are applied to one (483) of the transistors in the multivibrator (48), whose cut off controls that of chopper transistor (11).

8. A power supply device as in one of claims 4 to 6, of the type in which the free running operating frequency of the unstable multivibrator (48) is greater than the line frequency in order to limit the peak voltage ($V_{19max}$) on the collector of the chopper transistor (11), characterized by the fact that the transistor (480) in the multivibrator (48), whose state is complementary to that of the chopper transistor (11), is fed on its base through a diode (4803) by a synchronizing stage (49), which supplies negative pulses whose amplitude is equal to a predetermined fraction of that of the line return pulses, in order to lengthen the cut off state of this transistor (480) until the sum of these lengths is equal to the line period.

* * * * *